United States Patent

Wang et al.

[11] Patent Number: 6,052,034
[45] Date of Patent: Apr. 18, 2000

[54] METHOD AND APPARATUS FOR ALL DIGITAL HOLDOVER CIRCUIT

[75] Inventors: Bor-Min Wang, Hsinchu; Shu-Fa Yang, Nan Tou, both of Taiwan

[73] Assignee: Industrial Technology Research Institute, Taiwan

[21] Appl. No.: 09/103,395

[22] Filed: Jun. 24, 1998

[51] Int. Cl.[7] .................................................... H03L 7/00
[52] U.S. Cl. ................................ 331/2; 331/25; 327/156
[58] Field of Search .................................. 331/2, 17, 1 A, 331/25, 14, 49, DIG. 2, DIG. 3; 327/156, 159, 147, 150

[56] References Cited

U.S. PATENT DOCUMENTS

| | | |
|---|---|---|
| 4,972,442 | 11/1990 | Steierman . |
| 5,043,677 | 8/1991 | Tomassetti et al. ......................... 331/2 |
| 5,072,195 | 12/1991 | Graham et al. ............................. 331/2 |
| 5,485,484 | 1/1996 | Williams et al. ....................... 375/376 |
| 5,572,167 | 11/1996 | Alder et al. . |
| 5,675,620 | 10/1997 | Chen ....................................... 375/376 |
| 5,883,533 | 3/1999 | Matsuda et al. ......................... 327/156 |

*Primary Examiner*—Robert Pascal
*Assistant Examiner*—Henry Choe

[57] ABSTRACT

An all-digital phase-locked loop (ADPLL) device includes a primary ADPLL circuit and a controller which allow an in-phase output signal to be generated even when the incoming reference signal is lost. The primary ADPLL loop includes a phase detector, a digital loop filter, a first digital control oscillator (DCO) for generating a loop signal which is phase-locked to a received reference signal, and a frequency divider. The controller generates control signals to be used by a secondary DCO or the first DCO to generate a synchronized system output signal. The controller includes an accumulator which accumulates the number of phase-hopping events performed by the first DCO for a certain time period, a first-in-first-out (FIFO) buffer which stores a number of consecutive phase-hopping samples from the accumulator, and a calculator for determining an average of the consecutive values stored in the FIFO buffer. The control signals generated by the controller may be used by the secondary DCO to achieve a synchronized system output signal during both normal and holdover operating modes, or may be used by a single DCO only during the holdover mode.

20 Claims, 9 Drawing Sheets

CONVENTIONAL PLL CIRCUIT

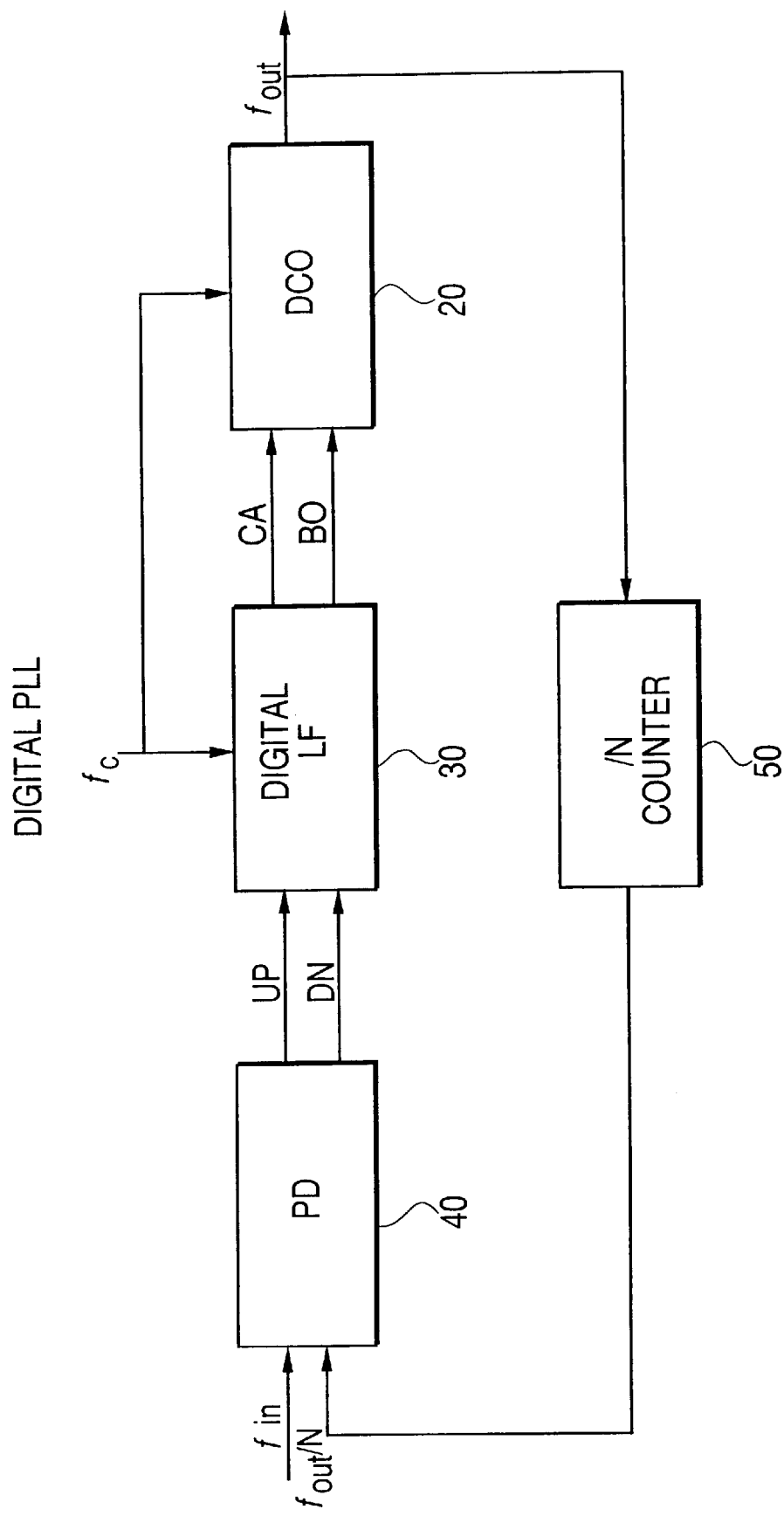

CALCULATE THE AVERAGE HOPPING NUMBER

METHOD AND APPARATUS FOR ALL DIGITAL HOLDOVER CIRCUIT

BACKGROUND OF THE INVENTION

1. Field of the Invention

The present invention relates to a method and an apparatus for controlling a phase-locked loop (PLL) system to generate a synchronized output signal during periods when the incoming reference signal is interrupted, and more particularly to a new method and apparatus for an all digital holdover circuit.

2. Description of the Related Art

In data transmission systems, the transmitter and the receiver must be synchronized to accurately access transmitted data. Phased-locked loop (PLL) circuits have been used for many years to achieve such synchronization. A typical PLL circuit receives an accurate reference input signal and performs a feedback control operation to lock the output signal in phase with the incoming reference signal. Essentially, an analog PLL circuit continuously tests the output of a voltage-controlled oscillator (VCO) through a feedback loop, and when the output of the VCO drifts away from the incoming reference signal, an error voltage is generated to pull the VCO back into synchronization with the incoming reference signal. PLL circuits thus have been widely used in a variety of applications such as communication systems, computers networks, television transmissions, etc.

As illustrated in FIG. 1, a conventional analog PLL circuit consists of three main components: a phase detector (PD) 14, a loop filter 12, and a voltage controlled oscillator (VCO) 10. The conventional analog PLL circuit illustrated in FIG. 1 further includes a frequency divider 16 which adjusts the frequency of the VCO output signal $f_{out}$ to correspond to the frequency of an incoming reference signal. The PD 14 compares an incoming reference signal $f_{ref}$ and the fed-back output of VCO 10 $f_{out}/N$, and generates an error signal which represents any phase differences between the reference signal $f_{ref}$ and the VCO output. The loop filter 12 acts as a low-pass filter, thereby removing alternating current (ac) components to provide a direct-current (dc) voltage signal to drive the VCO 10. This input voltage supplied from the loop filter 12 controls the output frequency of the VCO. The output $f_{out}$ of the VCO 10 is fed-back to the PD 14 through the frequency divider 16 and is continuously driven in a direction that will minimize the error signal generated by the PD 14. Once the signals $f_{ref}$ and $f_{out}/N$ are made equal, the output of VCO is said to be locked to the input reference signal, and any phase differences between the two signals will be controlled.

All digital PLLs have also been developed to continuously monitor the output of a digital control oscillator (DCO), instead of the analog VCO, and to generate digital control signals which pull the DCO back into synchronization with the incoming reference signal. Such all digital PLLs generally provide advantages over analog PLLs because expensive external components, such as a VCxO, are not required.

A problem occurs for conventional analog/digital PLL circuits used to synchronously read a transmitted information stream when the incoming reference signal is lost or interrupted. During the absence of the incoming reference signal, the output frequency of the VCO/DCO may drift, thereby causing the receiver to read data from the received information stream out of synchronization. Prior art techniques have therefore been developed to compensate for periods when the incoming reference signal is interrupted.

One such prior art technique for generating an in-phase output signal during a period of incoming reference signal absence selects an alternate reference signal when the primary incoming reference signal is lost. This holdover system, however, is not applicable to communication systems which use a single reference signal.

In another prior art holdover technique, two PLL circuits, each utilizing a VCxO, are provided to protect the accuracy of the output signal of the first PLL when the incoming signal is absent. In this system, however, two separate PLL circuits are required, in addition to a digital-to-analog converter which is needed to convert the signals from a digital up/down counter of the second PLL circuit to the analog signal needed for VCO input.

In yet another prior art technique, a PLL circuit having a VCO employs a crystal maintained at a constant temperature so that a phase-locked lock signal having minimal drift is provided. In this analog system, however, high power consumption is required to maintain the crystal at the constant temperature.

SUMMARY OF THE INVENTION

It is an object of the present invention to provide a phase-locked loop apparatus which maintains a phase-locked signal even when an incoming reference signal is absent or interrupted.

It is another object of the present invention to provide an all-digital phase-locked loop circuit which utilizes off the shelf components and consumes low power.

It is yet another object of the present invention to provide a method for maintaining a phase-locked signal upon absence or interruption of an incoming reference signal.

These and other objects are achieved by an apparatus for generating a synchronized output signal which includes:

a primary phase-locked loop (PPL) circuit which receives an incoming reference signal, outputs a loop signal, detects a phase difference between the incoming reference signal and the loop signal, generates a first control signal based on the phase difference, and adjusts the phase of said loop signal in accordance with said first control signal; and a controller which calculates an average number of phase adjustments performed by the primary PLL circuit for a given time period and generates a secondary control signal in accordance with the average number, the secondary control signal being used by the apparatus to generate the synchronized output signal during a holdover mode.

The objects of the present invention are further fulfilled by providing a method for synchronizing an output signal, including:

generating a phase-adjusted loop signal in accordance with a first control signal;

calculating an average number of phase adjustments indicated by the first control signal for a given time period; and generating a secondary control signal based on the result of the calculating step; wherein the method generates a synchronized output signal in accordance with the secondary control signal during a holdover mode.

The PLL apparatus of the present invention includes a primary all-digital phase-locked loop (ADPLL) circuit having a phase detector, a digital loop filter, and a DCO. When a reference signal is received (normal operating mode), the phase detector determines phase differences between the incoming reference signal and the loop output signal. The digital loop filter generates control signals based on such phase differences. The control signals from the digital loop filter cause the DCO to adjust the loop output by performing a phase-hopping operation. During this period, an accumulator monitors the phase-hopping events performed by the DCO. A series of consecutive phase-hopping accumulation values are stored.

An average of a predetermined number of phase-hopping accumulation values is used to generate secondary control signals which control the phase-hopping operation of a second DCO during both a normal operating mode and a holdover mode, or which control the DCO of the primary ADPLL loop during the holdover mode. In this device, the phase adjustments during the holdover mode are performed based on previous normal operating mode phase-hopping operations and thereby provide a stable output signal with minimal drift. Furthermore, all circuits of this PLL apparatus can be implemented with off the shelf digital components.

Further scope and applicability of the present invention will become more readily apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 illustrates an all digital phase-locked loop apparatus to which embodiments of the present invention are applicable;

DETAILED DESCRIPTION OF THE PREFERRED EMBODIMENTS

The present holdover mode apparatus/method is particularly applicable to an all-digital phase-locked loop (ADPLL) circuit such as that previously disclosed in co-pending applications Ser. Nos. 08/555,941 and 08/816,249, filed Nov. 13, 1995 and Mar. 13, 1997 respectively, which are each incorporated herein by reference in their entirety. Although described in the context of the ADPLL circuit set forth in these co-pending applications, the holdover method/apparatus described herein is equally applicable to other types of ADPLL circuits as will be apparent to one having ordinary skill in the art.

The previously disclosed ADPLL circuit illustrated in FIG. 2 includes four main components: a digital control oscillator (DCO) 20, a digital loop filter 30, a phase detector (PD) 40, and a /N counter 50. The /N counter 50 receives a loop output signal $f_{out}$ from the DCO 20 and adjusts the frequency of $f_{out}$ to correspond to the frequency of an incoming reference signal. The PD 40 receives two incoming signals, $f_{in}$ and $f_{out}/N$, which respectively represent an input reference signal and the fed-back output of the DCO 20, and compares $f_{in}$ and $f_{out}/N$ to detect any phase differences. The PD 40 outputs signals UP and DN which signify phase differences between $f_{in}$ and $f_{out}/N$.

Figure 1:
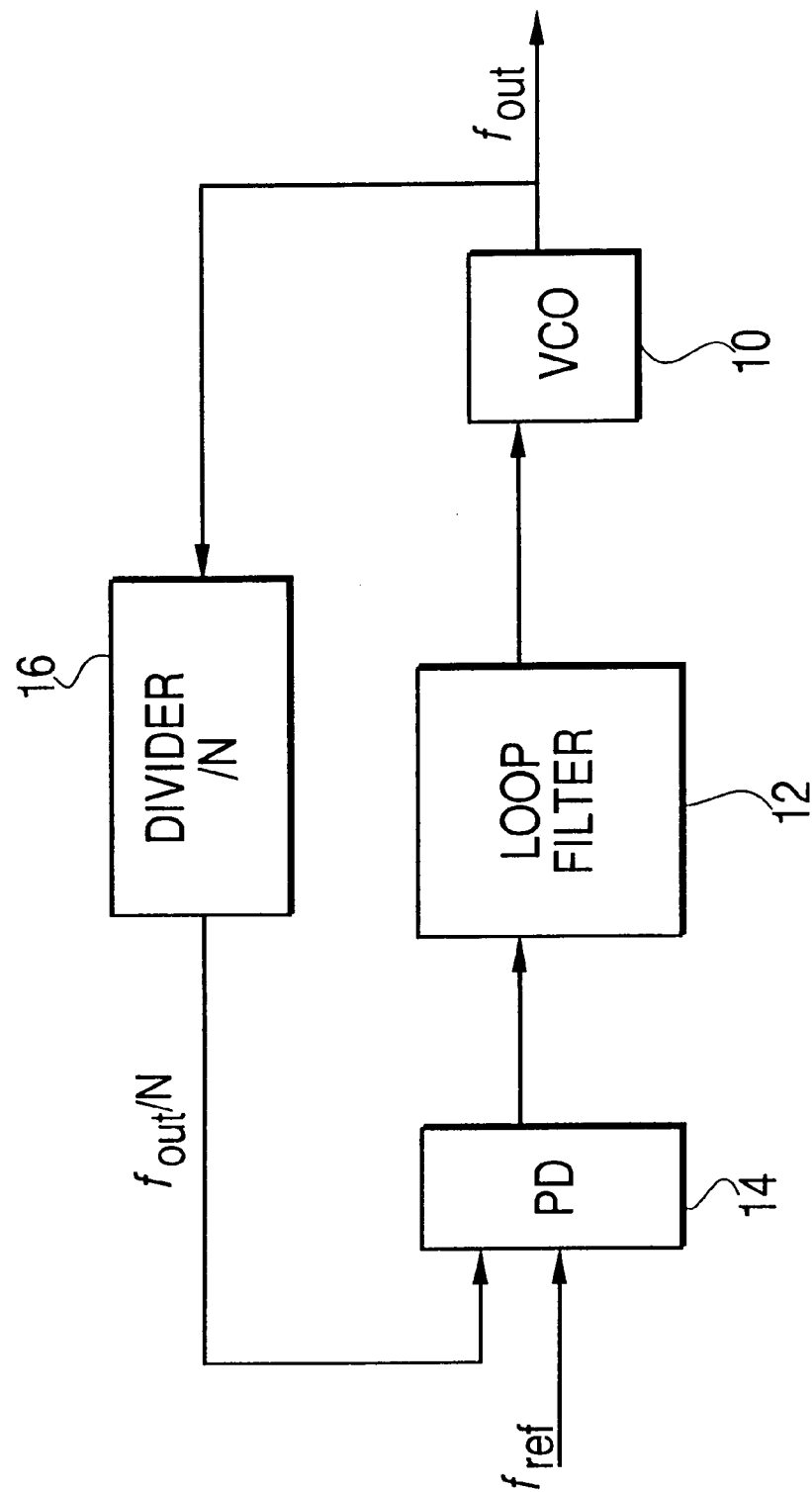
FIG. 1 illustrates a conventional analog phase-locked loop apparatus.
Figure 3A:
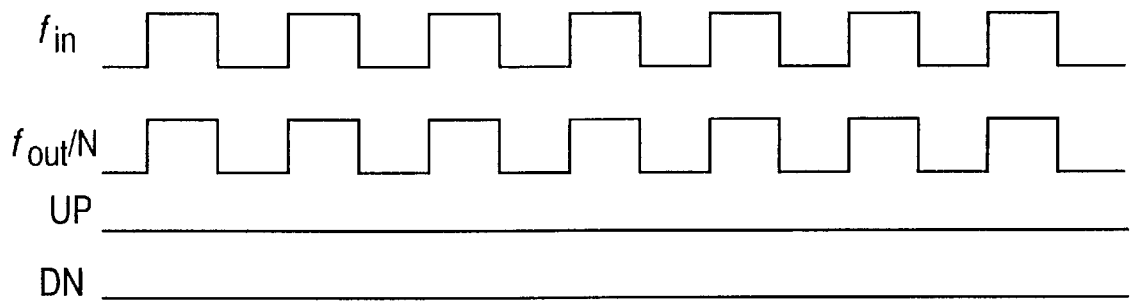
FIG. 3A illustrates the waveforms associated with the phase detector when the reference and loop output signals are in-phase.
Figure 3B:
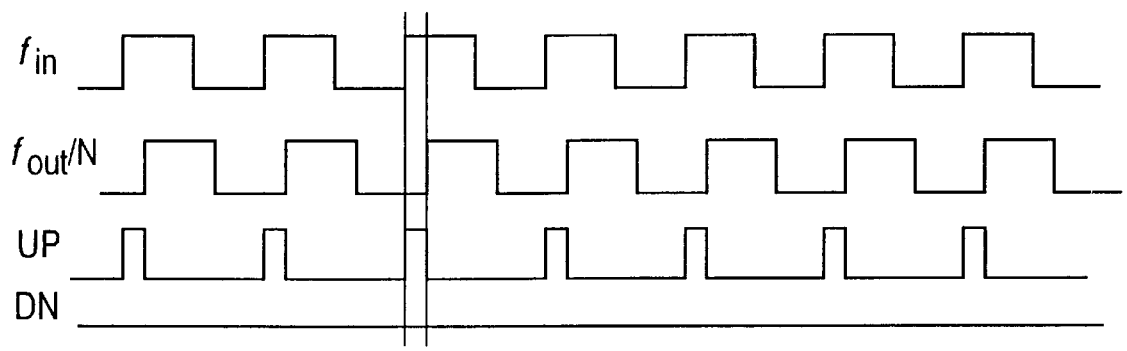
FIG. 3B illustrates the waveforms associated with the phase detector when there is a positive phase error between the reference and loop output signals.
Figure 3C:
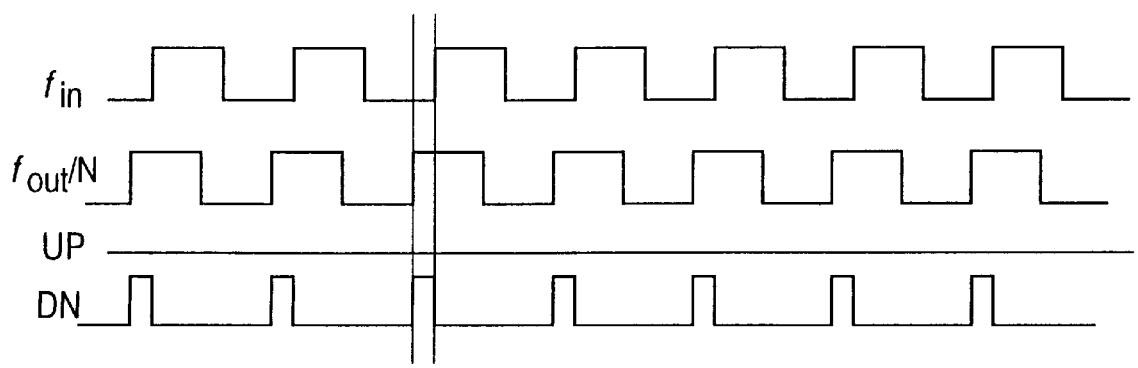
FIG. 3C illustrates the waveforms associated with the phase detector when there is a negative phase error between the reference and loop output signals.

As shown for example in FIG. 3A, when $f_{in}$ and $f_{out}/N$ are in phase the positive edges of these signals occur at the same time, thereby creating a zero level output from the PD 40. As illustrated in FIG. 3B, when the positive edge of the reference signal $f_{in}$ leads the positive edge of the fed-back output signal $f_{out}/N$, these signals are out of phase, and the UP portion of the PD 40 output is pulsed to set the PD 40 in a state which signifies a positive phase error. As illustrated in FIG. 3C, when the positive edge of $f_{in}$ lags the positive edge of $f_{out}/N$, these signals are again out of phase, and the DN portion of the PD 40 output is pulsed to set the PD 40 in a state which signifies a negative phase error.

The output signals UP and DN from the PD 40 are sent to the digital loop filter (LF) 30 which operates in conjunction with the DCO 20 to adjust the output of the ADPLL circuit. When the total pulse width of the UP signal output from PD 40 is greater than that of the DN signal, the frequency of the loop output will be increased (i.e., sped up). When, on the other hand, the total pulse width of the UP signal is smaller than that of the DN signal, the frequency of the loop output will be reduced (i.e., slowed down).

The digital LF 40 may consist of, for example, a K-counter having both an up counter and a down counter which together allow the k-counter to generate a "carry" output (CA) and a "borrow" output (BO). The CA and BO signals generated by the digital LF 30 are output and received by the DCO 20. When the DN output of the PD 40 is active, this enables the down counter of the digital LF 30 to decrease a count value maintained by the K-counter. When, on the other hand, the UP output from the PD 40 is active, this enables the up counter of the digital LF 30 to increase the count value maintained by the K-counter. Therefore, when the digital LF 30 is in a state of "underflow" as a result of the counting operations of the up and down counters, a "borrow" pulse is generated for signal BO. On the other hand, when the digital LF 30 is in a state of "overflow" as a result of the counting operations performed by the up and down counters, a "carry" pulse is generated for signal CA.

Figure 4:
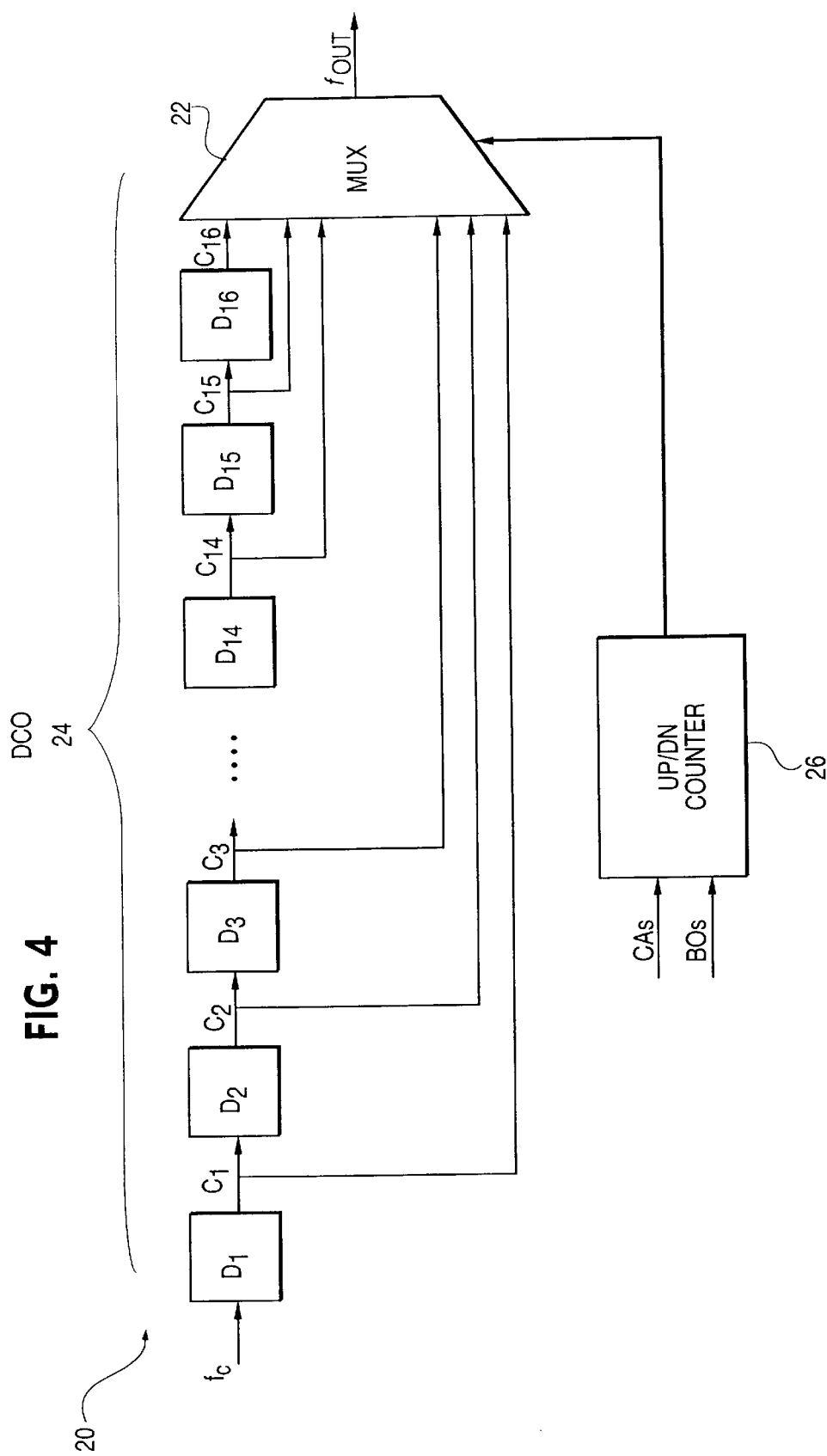
FIG. 4 illustrates a configuration of a digital control oscillator for an all-digital phase-locked loop circuit.

The DCO 20 receives the CA and BO signals from the Digital LF 30, and further receives a local clock signal $f_c$. As illustrated in FIG. 4, the DCO 20 may be configured to include three main components: a delay line 24 having L delay stages, an UP/DN Counter 26, and a multiplexer 22. The delay line 24 receives the local clock signal $f_c$ and, in the example illustrated in FIG. 4, has sixteen delay stages $D_1$–$D_{16}$ (L=16) which together generate sixteen phase-different clock signals $C_1$–$C_{16}$. Each of the sixteen phase-different clock signals $C_1$–$C_{16}$ is sent to the multiplexer 22. This series of phase-different clock signals $C_1$–$C_{16}$ allow the DCO 20 to implement a phase-hopping action which compensates for phase errors detected by the PD 40.

Figure 5:
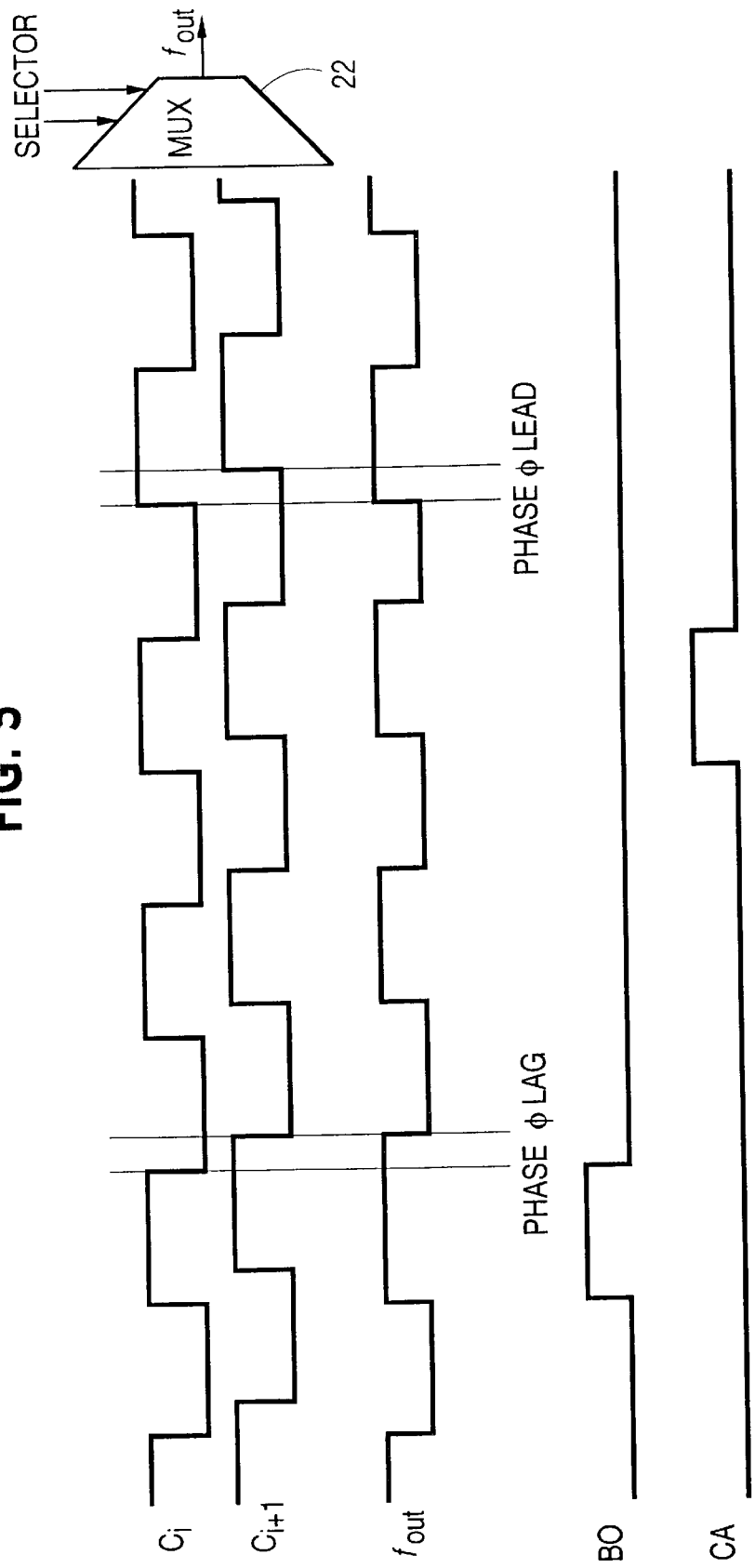
FIG. 5 illustrates the waveforms associated with phase-hopping operations performed by the digital control oscillator illustrated in FIG. 4.

As illustrated in FIG. 5, "borrow" pulses of signal BO cause the DCO 20 to select a phase-different clock signal among $C_1$–$C_{16}$ to delay the loop output signal $f_{out}$. On the other hand, "carry" pulses on signal CA cause the DCO 20 to select a local clock signal from $C_1$–$C_{16}$ which advance the loop output signal $f_{out}$.

In the specific example illustrated in FIG. 5, a BO pulse initially directs the multiplexer 22 to select a phase-lagging signal $C_{i+1}$ so that $f_{out}$ is slowed down. As a subsequent phase error is detected in the opposite direction, a CA pulse directs the multiplexer 22 to select phase-leading signal $C_i$ so that $f_{out}$ is sped up. In this way, each time the BO pulse forces the multiplexer to select a phase-lagging local clock, the loop's output is delayed by 1/L cycle. Likewise, each time the CA pulse forces the multiplexer to select a phase-leading local clock, the loop's output is advanced by 1/L cycle. Accordingly, 16 phase hopping events in the phase-leading direction will cause the loop's output to advance by 1 Hz, and the same number of phase hopping events in the phase-lagging direction will cause the loop's output to be delayed 1 Hz.

The UP/Dn counter 26 of the DCO illustrated in FIG. 4 accepts the CA and BO signals from the digital LF 30 and outputs an address to multiplexer 22, to thereby select a corresponding phase-different clock from the set of phase different clocks $C_1$–$C_{16}$ provided by the delay line 24.

Figure 6:
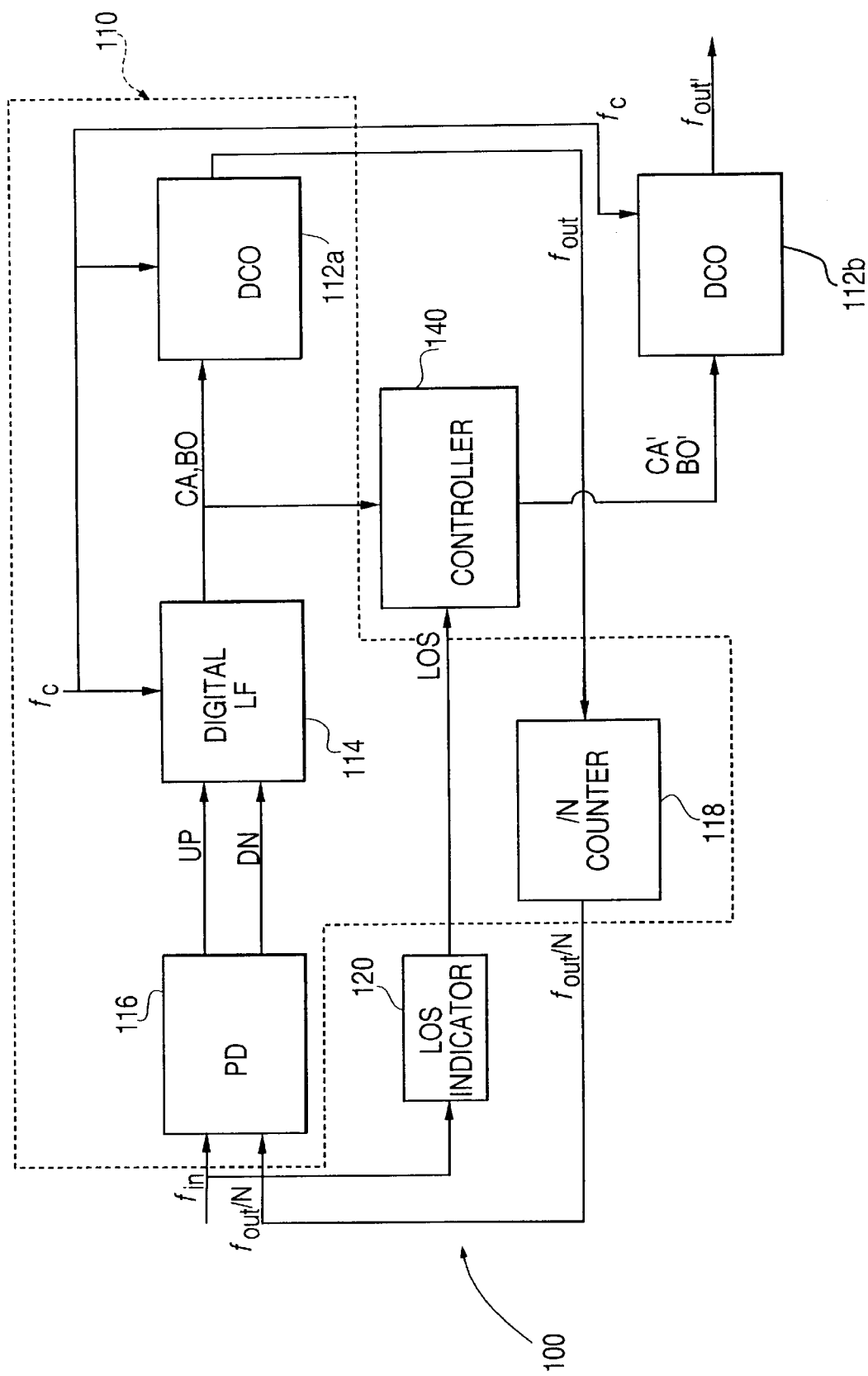
FIG. 6 illustrates a phase-locked loop apparatus, according to the present invention, which includes a controller for maintaining a phase-locked signal during the absence or interruption of an incoming reference signal.

FIG. 6 illustrates an apparatus, according to the present invention, for maintaining an in-phase output even when the incoming reference signal $f_{in}$ is interrupted or absent. This apparatus includes a primary ADPLL circuit 110 having components such as those illustrated in FIG. 2, and further includes components which maintain an in-phase output signal during a period when the incoming reference signal $f_{in}$ has been interrupted. Therefore, the apparatus illustrated in FIG. 6 is able to function accurately in both a normal operating mode and a holdover mode.

The primary ADPLL circuit which generates a phase-adjusted loop output signal $f_{out}$ is labelled 110 and includes a phase detector (PD) 116, a digital loop filter (LF) 114, a first digital control oscillator (DCO) 112a, and an N/ counter 118. The structural connection and operation of the elements in the ADPLL unit 110 have been described in detail with the regard to FIG. 2, and therefore a description of the connection and operation of these elements is omitted here. As will be detailed below, the loop output signal $f_{out}$ generated by the first DCO 112a is not output as the system clock, and instead is only used as a fed-back signal to the PD 116. Instead, in the embodiment illustrated in FIG. 6 a secondary DCO generates the output system signal during both a normal operating mode and a holdover mode.

To provide an in-phase output signal during both a normal operating mode and a holdover mode, the ADPLL apparatus illustrated in FIG. 6 includes, in addition to the primary ADPLL circuit 110, three main components: a loss of signal (LOS) indicator 120, a controller 140, and a second DCO 112b.

The LOS indicator 120 receives the incoming reference signal $f_{in}$ and outputs a LOS signal to the controller 140 to indicate when the incoming reference signal $f_{in}$ has been interrupted. The controller 140, which may be realized for example as a micro-controller, receives the control signals CA and BO output from the digital LF 114 in addition to the LOS signal output by the LOS indicator 120. The controller 140 outputs secondary control signals CA' and BO' which are used to control a phase-hopping operation of the second DCO 112b. The second DCO 112b receives the secondary control signals CA' and BO' output by the controller 140, receives the local clock signal $f_c$ which is similarly received by the first DCO 112a, and outputs a synchronized system output signal $f_{out}'$.

The operation of the ADPLL apparatus illustrated in FIG. 6 is described as follows. By receiving the incoming reference signal $f_{in}$, the LOS indicator 120 is able to determine when the incoming reference signal $f_{in}$ has been interrupted, and subsequently initiate a holdover mode. During both a normal operating mode and the holdover mode, the controller 140 generates secondary control signals CA' and BO' which, like the control signals CA and BO received by the first DCO 112a described above, control a phase-hopping operation by causing the second DCO 112b to select either a lagging phase-different clock signal or a leading phase-different clock signal, depending on whether the output signal $f_{out}'$ should be delayed or advanced.

Figure 7:
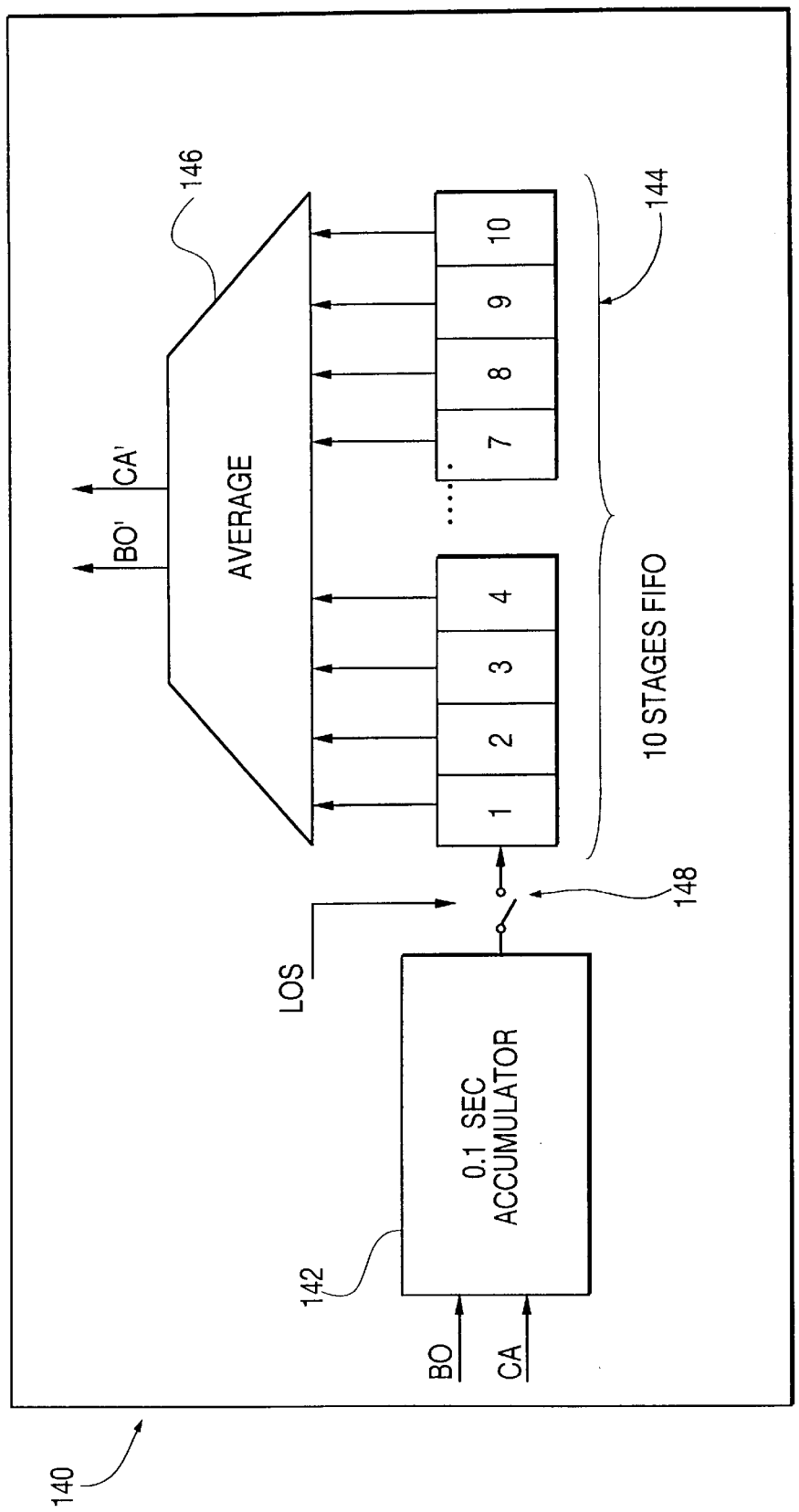
FIG. 7 illustrates a controller of the phase-locked loop apparatus illustrated in FIG. 6, according to the present invention, for generating a secondary control signal which controls the phase-hopping operation.

A specific arrangement which may be utilized as the controller 140 is illustrated in FIG. 7, and includes four main components: an accumulator 142, a first-in-first-out (FIFO) buffer 144, an average calculator 146, and a switch 148. During the normal operating mode of the ADPLL apparatus 100, the accumulator receives the phase-hopping control signals CA and BO output by the digital LF 114 which control the phase-hopping operation of the first DCO 112a. The accumulator 142 accumulates the phase-hopping events represented by the phase-hopping control signals CA and BO that occur in a given time period (e.g., 0.1 seconds). Each accumulation value is output by the accumulator 142. The FIFO buffer 144 receives consecutive accumulation values output by the accumulator 142 via a closed switch 148. The LOS signal output by the LOS indicator 120 keeps the switch 148 closed during the normal operating mode so that consecutive accumulation values are shifted into the FIFO buffer 144. On the other hand, the LOS signal output by the LOS indicator 120 opens the switch 148 during the holdover mode so that no additional accumulation values from the accumulator 142 are shifted into the FIFO buffer 144 until the incoming reference signal $f_{in}$ has been restored.

The FIFO buffer 144 stores a number of consecutive accumulation values from the accumulator 142. In FIG. 7, the FIFO buffer has ten stages, and thus stores ten consecutive outputs from the accumulator 142. The consecutive values stored in the FIFO buffer of FIG. 7 thus represent a full second of phase-hopping events performed by the first DCO 112a. Alternatively, the FIFO buffer 144 may consist of a greater or lesser number of stages, such as one hundred, to store accumulation values for a longer/shorter period of time (e.g., 10 seconds). The FIFO buffer 144 outputs each accumulation value stored therein to an average calculator 146.

The average calculator 146 receives the plurality of accumulation values output by the FIFO buffer 144 and computes the average of these values. This average value is used to generate secondary control signals BO' and CA' which are output by the controller 140 to control the direction (i.e, phase-lagging direction or phase-leading direction) and hopping operation count (i.e., number of phase-hopping events for a given time period) of the second DCO 112b.

The average calculator 146 generates two values (d, x), with x representing the average number of hopping events for given time period (e.g., 0.1 seconds) and d representing the phase hopping direction. For example, when d=0, the second DCO 112b will increase the output frequency of signal $f_{out}'$ x number of times for each 0.1 second time period. On the other hand, when d=1, the second DCO 112b will decrease the output frequency of signal $f_{out}'$ x number of times each 0.1 second time period. As illustrated in FIG. 7, the secondary control signals CA' and BO' are used to represent (d, x), and are output by the controller 140 to the second DCO 112b. Thus during the normal operating mode of the embodiment illustrated in FIG. 6, the secondary control signals CA' and BO' generated by the controller 140 are based on a running average of the phase-hopping events indicated by the first control signals CA and BO.

For the holdover mode operation of the ADPLL apparatus illustrated in FIGS. 6–7, when the LOS indicator 120 senses that the incoming reference signal $f_{in}$ is absent, a holdover mode is initiated so that the FIFO buffer 144 ceases to receive additional accumulation values from the accumulator 142. The average of the values stored in the FIFO buffer 144 at this instant, calculated by the average calculator 146, is used during the entire holdover mode duration to generate secondary control signals CA' and BO' for the second DCO 112b output signal $f_{out}'$. Thus during the holdover mode, the secondary control signals CA' and BO' generated by the controller 140 are based on a constant average of the values stored in the FIFO 144 when a loss of incoming reference is indicated by the signal LOS. Because the LOS indicator 120 takes less that 0.1 second to detect that the incoming reference signal $f_{in}$ is absent, the values that are shifted into the FIFO buffer 144 will always be available and accumulation values for a shortened accumulation period (caused by a loss of $f_{in}$) will not be output to the FIFO, thereby ensuring the output quality of the second DCO 112b output signal $f_{out}'$. As soon as the LOS indicator 120 detects that the incoming reference signal $f_{in}$ is present, the accumulator 142 resets and accumulates the phase hopping events represented by signals CA and BO again.

As discussed above with reference to FIG. 4, like the first DCO 112a, the second DCO 112b may include a delay line 24 which receives the local clock signal $f_c$ and generates a number of phase-different clock signals $C_1$–$C_{16}$.

Figure 8:
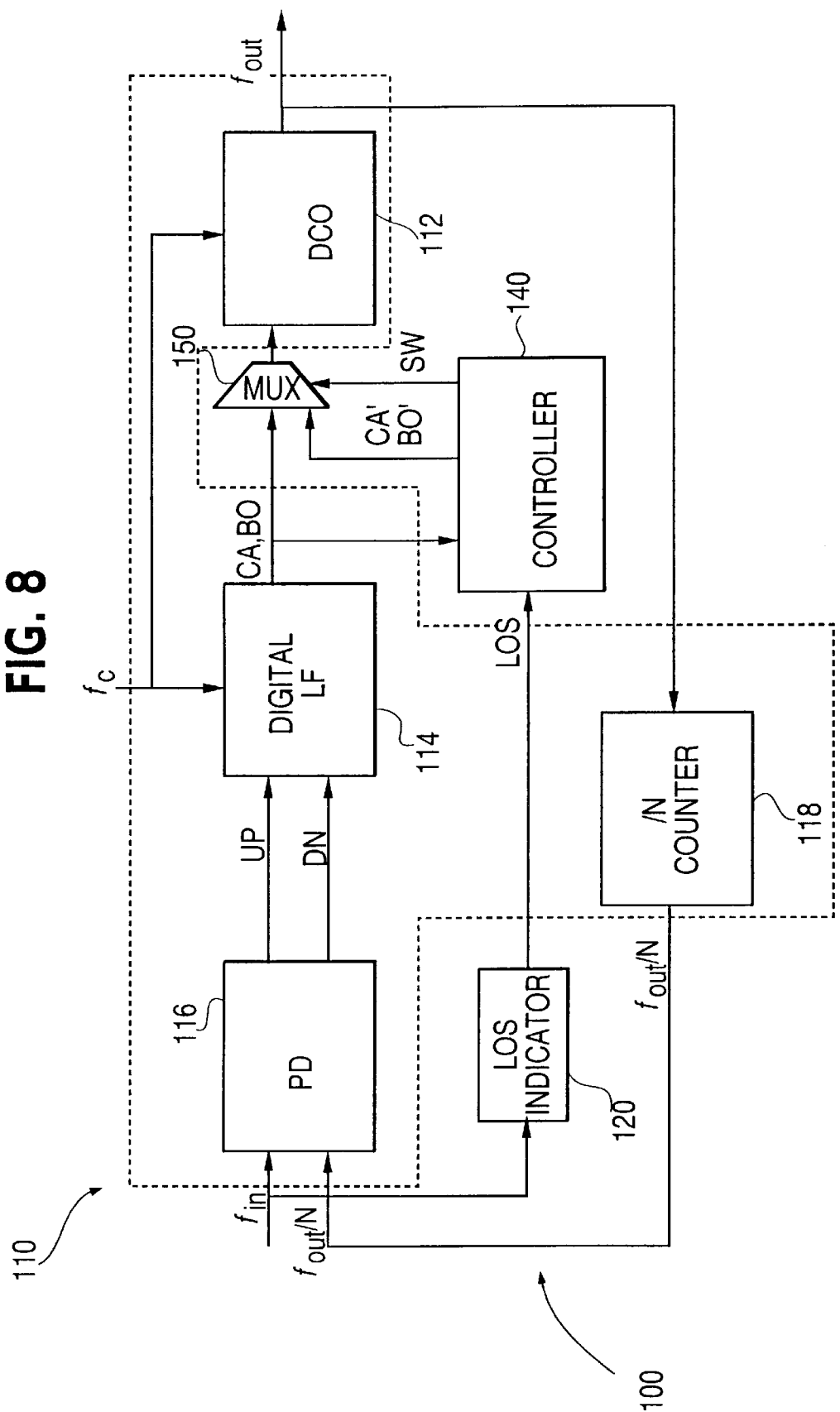
FIG. 8 illustrates a modified phase-locked loop apparatus, according to the present invention, having a holdover circuit for maintaining a phase-locked signal during absence of an incoming reference signal.

FIG. 8 illustrates an alternative embodiment, according to the present invention, for maintaining an in-phase output signal when an incoming reference signal $f_{in}$ is interrupted. For this embodiment, the operation of the primary ADPLL circuit 110 (including the PD 116, the digital LF 114, the DCO, the IN counter 118) and the LOS indicator 120 is the same as that described in detail above. Accordingly, a discussion of these components will be mostly omitted for the description of the alternative embodiment illustrated in FIG. 8.

In the embodiment illustrated in FIG. 8, instead of a second DCO 112b, a multiplexer 150 receives the secondary control signals CA' and BO' generated and output by the controller 140. The multiplexer 150 is positioned between the digital LF 114 and the DCO 112 to receive the control signals CA and BO output by the digital LF 114. The multiplexer 150 is further positioned between the controller 140 and the DCO 112 to receive the secondary control signals CA' and BO' generated and output by the controller 140. The multiplexer 150 further receives a switching signal SW from the controller 140 which instructs the multiplexer 150 to output the normal operating mode phase-hopping control signals CA, BO or the secondary control signals CA', BO'.

The alternative embodiment illustrated in FIG. 8 operates as follows. When the LOS indicator 120 senses that the incoming signal is absent, the ADPLL apparatus operates in a holdover mode. When operating in the holdover mode, as discussed above, the FIFO buffer 144 of the controller 140 stops receiving accumulation values from the accumulator 142. The average value computed by the average calculator 146 at the instant the incoming reference signal $f_{in}$ is lost and the switch 148 opened is used during the entire holdover mode.

When the holdover mode is initiated, the controller 140 outputs a signal SW to the multiplexer 150 to indicate that the secondary control signals CA', BO' are to be output to the DCO 112 instead of the normal operating mode control signals CA, BO. Consequently, the DCO 112 performs the phase-hopping operation discussed above in accordance with the secondary control signals CA' and BO' generated by the controller 140. When the incoming reference signal $f_{in}$ is restored, the accumulator 142 resets, and the controller again instructs the multiplexer 150 to select the normal operating mode phase-hopping control signals CA, BO as the input to the VCO 112 in accordance with the signal SW received from the controller 140. Therefore, in the alternative embodiment illustrated in FIG. 8, the loop output signal of a single DCO 112 is used as the system output signal and is adjusted based on control signals CA, BO during a normal operating mode and secondary control signals CA', BO' during a holdover mode.

Figure 9:
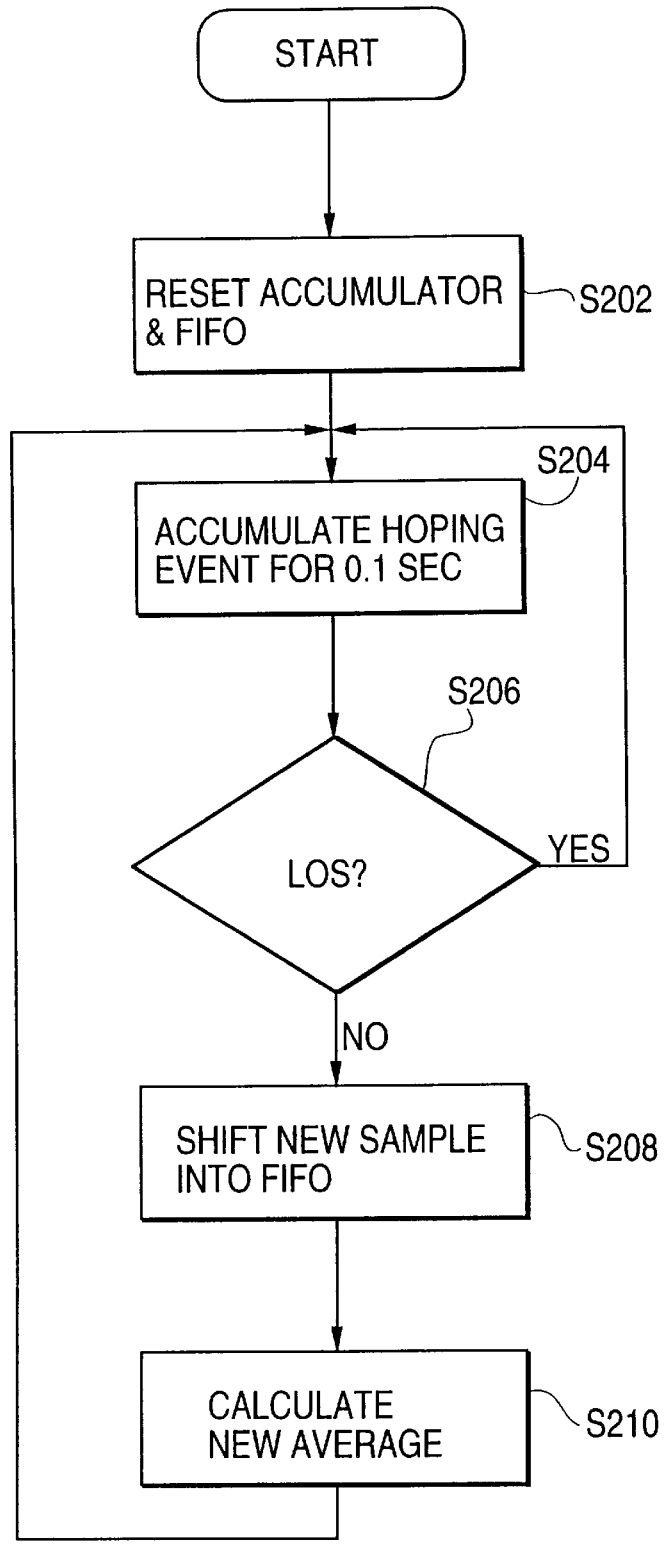
FIG. 9 is a flowchart, according to the present invention, which illustrates a method for generating secondary control signals used to control a phase-hopping operation.

FIG. 9 is a flowchart which illustrates a method, according to the present invention, for calculating the secondary control signals CA' and BO'. Specifically, as indicated by step S202, the accumulator 142 and the FIFO buffer 144 are reset immediately following a holdover mode. Next at step S204, the accumulator 142 accumulates phase-hopping events indicated by control signals BO and CA for a given time period (e.g., 0.1 seconds). Next at step S206, it is determined whether the LOS indicator 120 indicates that the incoming reference signal $f_{in}$ has been lost. If "NO," the accumulation value generated by the accumulator 142 is shifted into the FIFO buffer 144 at step S208. If, on the other hand, the determination at step S206 is "YES," the operation returns to step S204 described above. After step S208, the holdover mode operation proceeds to step S210, at which the average calculator 146 averages the values stored in the FIFO buffer 144. The operation next returns to step S204, at which the accumulator 142 accumulates an additional hopping event for the given time period (e.g., 0.1 seconds).

The ADPLL embodiments illustrated in FIGS. 6–8, which include holdover mode components, accurately generate synchronized output signals even when the incoming reference signal $f_{in}$ has been lost. For example, according to the embodiment illustrated in FIG. 6, where the accumulation sample period is 0.1 seconds, the FIFO buffer 144 has ten stages, and the VCO utilizes a 16 stage delay line, the average output value generated by the controller 140 covers a full second of phase-hopping events (i.e., 0.1 second accumulation period×10 FIFO stages). The error of this average will be ±1/16 clock signal errors per second. If the output clock frequency is 50 Mhz, the clock accuracy will thus be $\frac{1}{16} \times \frac{1}{50}$ ppm=$1.25 \times 10^{-3}$ ppm.

In addition to holdover mode accuracy, the ADPLL embodiments according to the present invention illustrated in FIGS. 6–8 can be achieved with a low level of hardware complexity, using a single ADPLL circuit, without requiring analog components, an AD/DA converter, or an expensive VCxO component. Additionally, the circuit can be implemented using a purely digital cell library or field programmable gate array (FPGA).

Although the invention has been described using a particular primary ADPLL circuit having a digital loop filter which generates control signals CA and BO, it will be evident to one having ordinary skill in the art that the present invention can extend to various kinds of ADPLL circuits. For example, certain ADPLL circuits adjust the output frequency generated by a DCO by using insert and delete pulses, instead of CA and BO pulses. Applying the concepts described above to such a circuit, insert/delete pulses may be accumulated for a certain period of time by the accumulator, and the average of these events can be taken in similar fashion to that described above to generate the secondary control signals CA' and BO'.

Similarly, certain ADPLL circuits control the output frequency by using a programmable frequency divider. In such a circuit, when the frequency of the DCO output should be increased, a smaller frequency divisor is used. On the other hand, when the frequency of the DCO output should be slowed down, a larger frequency divisor is used. Therefore, for such an ADPLL circuit, the accumulator of the present invention may record the count of larger/smaller divisors used within a given time period, and use the average of such a count to generate the secondary control signals CA' and BO'.

Furthermore, while the invention has been described in connection with what is presently considered the most practical and preferred embodiments, it is to be understood that the invention is not limited to the disclosed embodiments, but to the contrary, is intended to cover various modifications included within the spirit and scope of the appended claims.

What is claimed is:

1. An apparatus for generating a synchronized output signal comprising:

a primary phase-locked loop (PPL) circuit which receives an incoming reference signal during a normal operating mode, outputs a loop signal, detects a phase difference between said incoming reference signal and said loop signal, generates a first control signal based on said phase difference, and adjusts the phase of said loop signal in accordance with said first control signal; and a controller which calculates an average number of phase adjustments performed by said primary PLL circuit for a given time period and generates a secondary control signal in accordance with said average number, said secondary control signal being used by said apparatus to generate said synchronized output signal during a holdover mode in which said primary PLL circuit does not receive said incoming reference signal.

2. The apparatus according to claim 1, wherein said PLL circuit includes;

an oscillator which receives a local clock signal and one of said first control signal and said secondary control signal, and generates said phase-adjusted loop signal as said synchronized output signal, a phase detector which receives said loop signal and said input reference signal, detects a phase difference between said loop signal and said input reference signal, and outputs an error signal based on said detected phase difference, and a digital loop filter which receives said error signal from said phase detector and outputs said first control signal.

3. The apparatus according to claim 1, wherein said primary PLL circuit includes;

a first oscillator which receives a local clock signal and said first control signal and generates a phase-adjusted loop signal in accordance with said first control signal, a phase detector which receives said loop signal and said input reference signal, detects a phase difference between said loop signal and said input reference signal, and outputs an error signal based on said detected phase difference, and a digital loop filter which receives said error signal from said phase detector, generates said first control signal based on said error signal received from said phase detector, and outputs said first control signal, and wherein said apparatus further comprises:

a second oscillator which receives said local clock signal and said secondary control signal, and generates said synchronized output signal in accordance with said secondary control signal.

4. The apparatus according to claim 3, wherein said second oscillator generates said synchronized output signal in accordance with said secondary control signal during both a normal operating mode and said holdover mode.

5. The apparatus according to claim 1, further comprising:

an indicator which detects when said input reference signal is interrupted, and outputs an enable signal to said controller which instructs said controller to switch from a normal operating mode to said holdover operating mode.

6. The apparatus according to claim 1, wherein said controller comprises:

an accumulator which counts the number of phase adjustments performed by said primary PLL circuit during a predetermined time period, generates an accumulation value for each predetermined time period, and outputs said accumulation value, memory which receives said accumulation value from said accumulator during a normal operating mode, and stores a series of consecutive accumulation values, and averaging means which calculates the average of the consecutive accumulation values stored in said memory.

7. The apparatus according to claim 6, wherein said memory is a first-in-first-out (FIFO) buffer.

8. The apparatus according to claim 1, wherein said apparatus is an all-digital phase-locked loop apparatus.

9. The apparatus according to claim 2, wherein said oscillator is a digital control oscillator.

10. The apparatus according to claim 3, wherein said first oscillator and said second oscillator are each a digital control oscillator.

11. The apparatus according to claim 8, wherein said all-digital phase-locked loop apparatus is implemented with a field-programmable gate array.

12. A method for synchronizing an output signal, comprising:

receiving an incoming reference signal during a normal operating mode;

generating a phase-adjusted loop signal in accordance with a first control signal, said first control signal being determined as a function of said incoming reference signal;

calculating an average number of phase adjustments indicated by said first control signal for a given time period; and generating a second control signal based on the result of said calculating step; wherein said method generates a synchronized output signal in accordance with said secondary control signal during a holdover mode in which said incoming reference signal is not received.

13. The method according to claim 12, wherein said calculating step includes:

accumulating a number of phase adjustments indicated by said first control signal for a predetermined time period to generate an accumulation value for each predetermined time period, storing a predetermined number of consecutive accumulation values during a normal operating mode, and averaging said predetermined number of consecutive accumulation values.

14. The method according to claim 13, wherein said storing step is achieved by shifting consecutive accumulation values into a first-in-first-out (FIFO) buffer.

15. The method according to claim 14, wherein said method further comprises:

detecting when said input reference signal is interrupted to initiate said holdover mode; and suspending said step of shifting consecutive accumulation values into said FIFO buffer during said holdover mode.

16. The method according to claim 12, wherein said method generates said synchronized output signal in accordance with said secondary control signal during said normal operating mode and said holdover mode.

17. The method according to claim 12, wherein said phase-adjusted loop signal is generated by a first oscillator, and said synchronized output signal is generated by a second oscillator.

18. The method according to claim 12, wherein said synchronized output and said phase-adjusted signal is generated by a single oscillator during both a normal operating mode and said holdover mode based on said secondary control signal.

19. The method according to claim 17, wherein said first oscillator and said second oscillator are each a digital control oscillator.

20. The method according to claim 18, wherein said oscillator is a digital control oscillator.

* * * * *